United States Patent [19]

Ogura et al.

[11] Patent Number: 5,132,767
[45] Date of Patent: Jul. 21, 1992

[54] DOUBLE GATE GTO THYRISTOR

[75] Inventors: Tsuneo Ogura; Katsuhiko Takigami, both of Yokohama; Akio Nakagama, Hiratsuka; Tomokazu Domon, Yokosuka, all of Japan

[73] Assignee: Kabushiki Kaisha Toshiba, Kawasaki, Japan

[21] Appl. No.: 701,002

[22] Filed: May 13, 1991

Related U.S. Application Data

[63] Continuation of Ser. No. 292,426, Dec. 30, 1988, abandoned, which is a continuation-in-part of Ser. No. 101,790, Sep. 28, 1987, Pat. No. 4,821,083.

[30] Foreign Application Priority Data

| Sep. 30, 1986 | [JP] | Japan | 61-231769 |
| Jan. 13, 1987 | [JP] | Japan | 62-3941 |
| Feb. 26, 1987 | [JP] | Japan | 62-41315 |
| Feb. 26, 1987 | [JP] | Japan | 62-41359 |
| Sep. 30, 1988 | [JP] | Japan | 63-246440 |

[51] Int. Cl.[5] .......... H01L 29/74; H01L 29/747; H01L 29/80; H01L 29/06
[52] U.S. Cl. .................. 357/38; 357/39; 357/23.4; 357/55; 357/22
[58] Field of Search .............. 357/38, 20, 55, 56, 357/90, 88, 22, 39, 23.4

[56] References Cited

U.S. PATENT DOCUMENTS

| Re. 32,784 | 11/1988 | Nakagawa et al. | 357/23.4 |
| 3,638,042 | 1/1972 | Studtmann | |
| 4,224,634 | 9/1980 | Svedberg | |
| 4,626,703 | 12/1986 | Patalong et al. | 357/38 |
| 4,821,083 | 4/1989 | Ogura et al. | 357/38 |

FOREIGN PATENT DOCUMENTS

| 0028797 | 5/1981 | European Pat. Off. |
| 0103181 | 3/1984 | European Pat. Off. |
| 0239866 | 10/1987 | European Pat. Off. |
| 0239866 | 3/1987 | Fed. Rep. of Germany |
| 54757 | 11/1974 | Japan |
| 59-52876 | 3/1984 | Japan |
| 0199663 | 1/1985 | Japan | 357/38 |
| 60-247969 | 12/1985 | Japan |
| 0149167 | 7/1987 | Japan | 357/38 |

OTHER PUBLICATIONS

High speed high voltage static Induction thyristor Y. Kajiwara, Y. Watakabe, M. Bessho, Y. Yakimoto and K. Shirehata.
Patent Abstracts of Japan, vol. 11, No. 7 (E-469)(2454) Jan. 9, 1987 & JP-A-61 182261; Toshiba Corp.
Patent Abstracts of Japan, vol. 10, No. 205, (E-420)(2261) Jul. 17, 1986 & JP-A-61 47667; Toyo Electric Mfg. Co. Ltd.
Patent Abstracts of Japan, vol. 10, No. 113 (E-399)(2170) Apr. 26, 1986 & JP-A-60 247969; Toyo Denki Seizo K.K.
I.E.E.E. Transactions On Electron Devices; vol. ED-34, No. 6, Jun. 1987, pp. 1396–1406, New York, USA; J. I. Nishizawa et al; "A Double-Gate-Type Static-Induction Thyristor".

Primary Examiner—Andrew J. James
Assistant Examiner—Wael Fahmy
Attorney, Agent, or Firm—Oblon, Spivak, McClelland, Maier & Neustadt

[57] ABSTRACT

There is disclosed a double gate GTO thyristor having a high gate gain and a high gate sensitivity, and capable of high speed turn-off. The double gate GTO thyristor comprises an anode/emitter layer, first and second base layers and cathode/emitter layer. A semiconductor layer having a conductivity type opposite to that of the anode/emitter layer is formed in the anode/emitter layer and located at a surface portion of the anode/emitter layer. A first gate electrode is connected to the first base layer, and a second gate electrode to the second base layer. An anode electrode is connected to the anode/emitter layer and all the surface of the semiconductor layer. A cathode electrode is connected to the cathode/emitter layer.

5 Claims, 18 Drawing Sheets

GATE CURRENT
$I_G$

ANODE VOLTAGE
ANODE CURRENT
$I_A, V_A$
TALE CURRENT INITIAL VALUE

POWER LOSS
$P(=V_A \times I_A)$ t1  t2 t3 t4  t5

FIG.4A FIRST GATE PULSE
$I_{G1}$

FIG.4B SECOND GATE PULSE
$I_{G2}$

FIG.4C ANODE CURRENT $I_A$
ANODE VOLTAGE $V_A$

FIG.4D POWER LOSS
$P(=V_A \times I_A)$

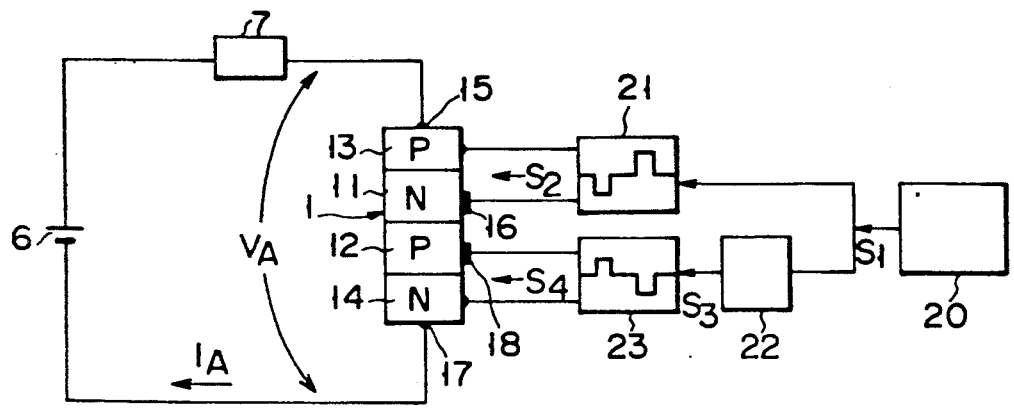
FIG. 5
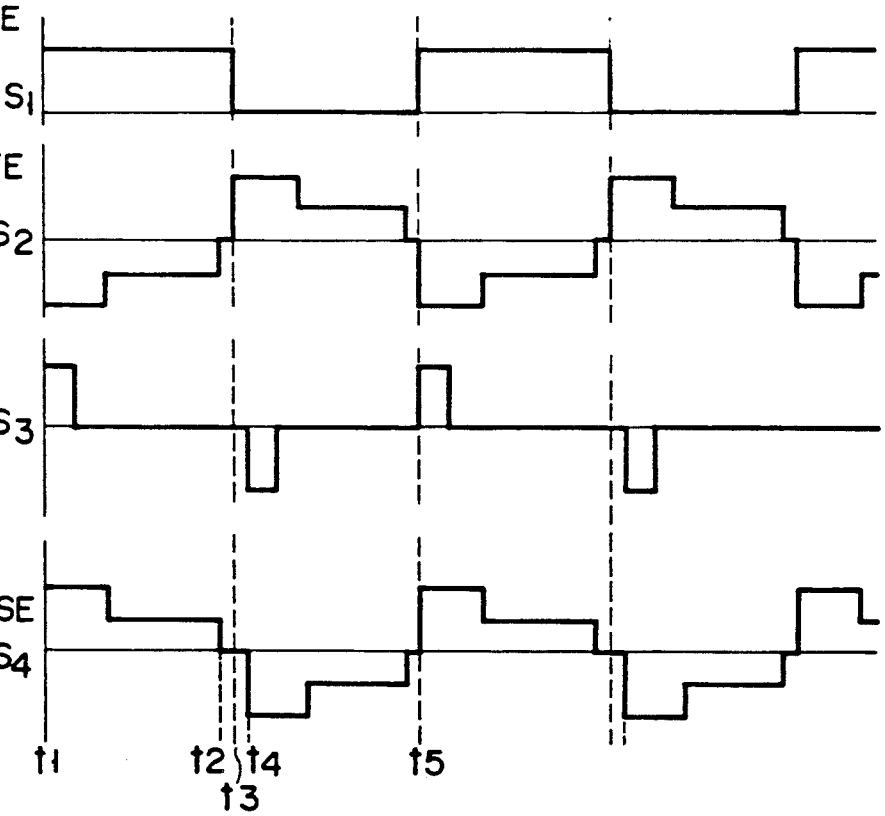
FIG.6A REFERENCE PULSE $S_1$
FIG.6B FIRST GATE PULSE $S_2$
FIG.6C DELAY PULSE $S_3$
FIG.6D SECOND GATE PULSE $S_4$

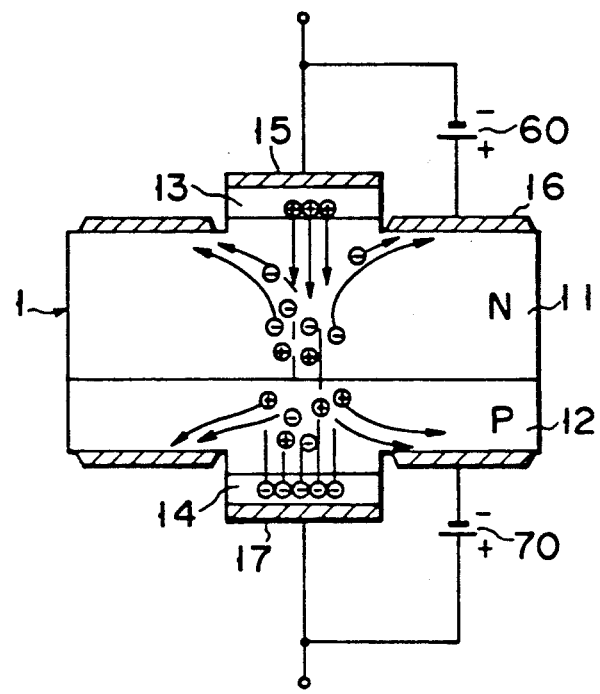
F I G. 7C
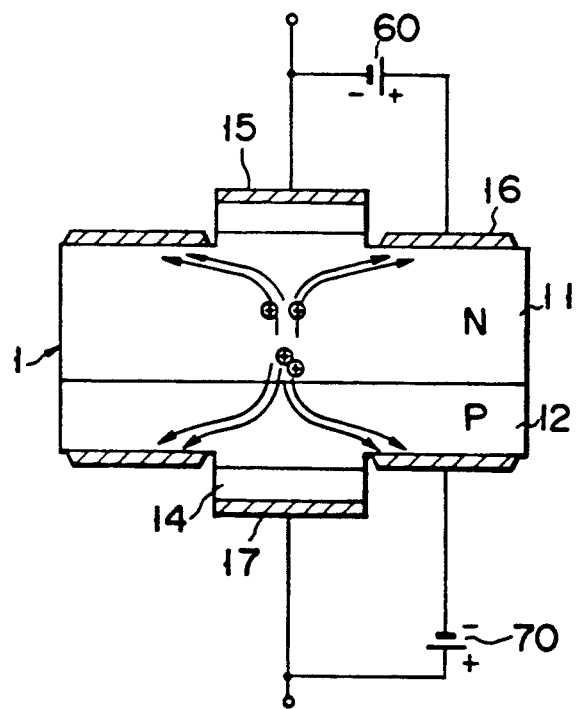
F I G. 7D

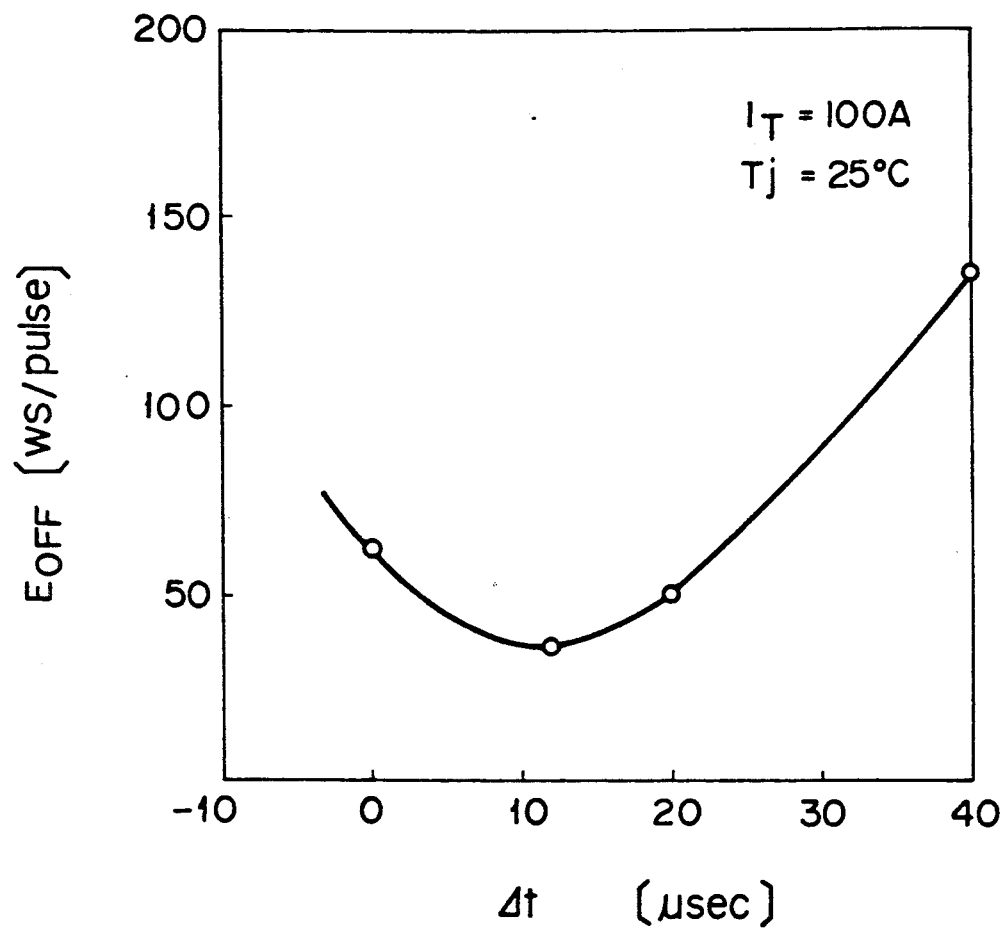
F I G. 10

FIG.12A TIMING PULSE (FIRST GATE ON)
FIG.12B TIMING PULSE (FIRST GATE OFF)
FIG.12C TIMING PULSE (SECOND GATE ON)
FIG.12D TIMING PULSE (SECOND GATE OFF)
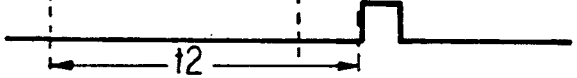
FIG.12E FIRST GATE PULSE
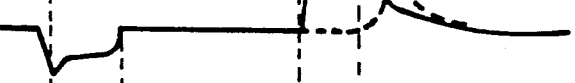
FIG.12F SECOND GATE PULSE
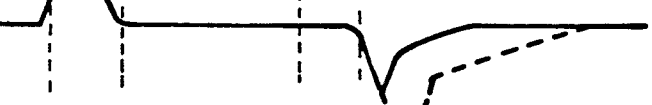
FIG.12G ANODE CURRENT $I_A$ ANODE VOLTAGE $V_A$
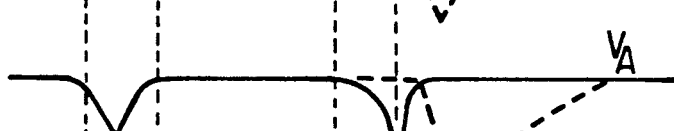
FIG.12H POWER LOSS $P = V_A \times I_A$

FIG.16
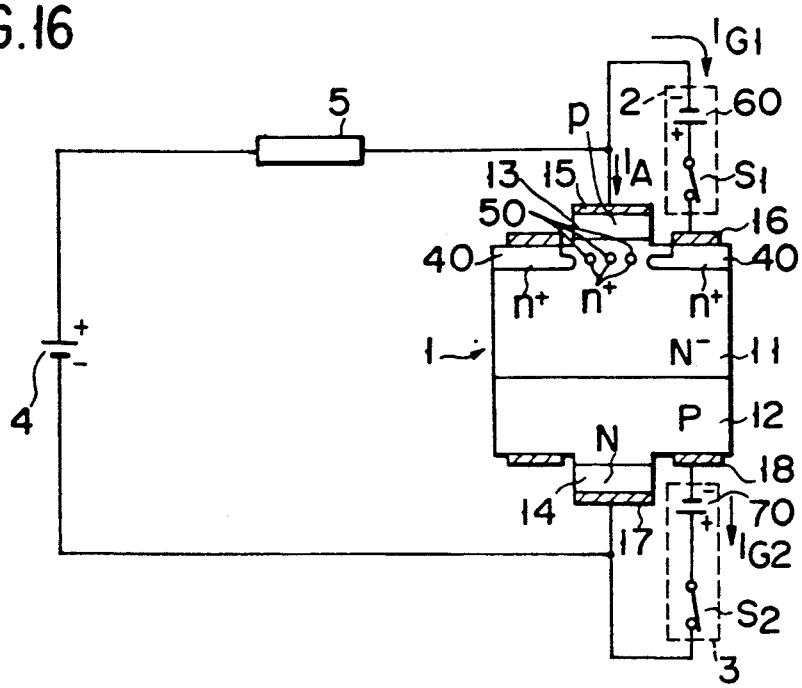
FIG.17A
FIRST GATE PULSE
$I_{G1}$
FIG.17B
SECOND GATE PULSE
$I_{G2}$
FIG.17C
ANODE CURRENT $I_A$
ANODE VOLTAGE $V_A$
FIG.17D
POWER LOSS
$P = (V_A \times I_A)$
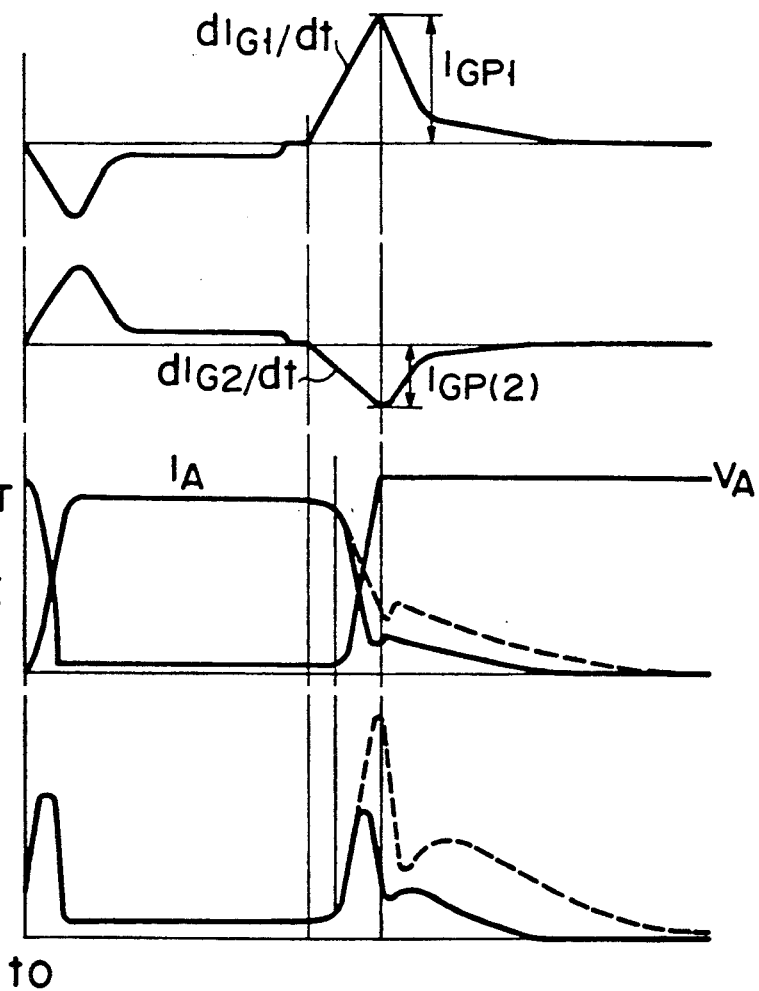

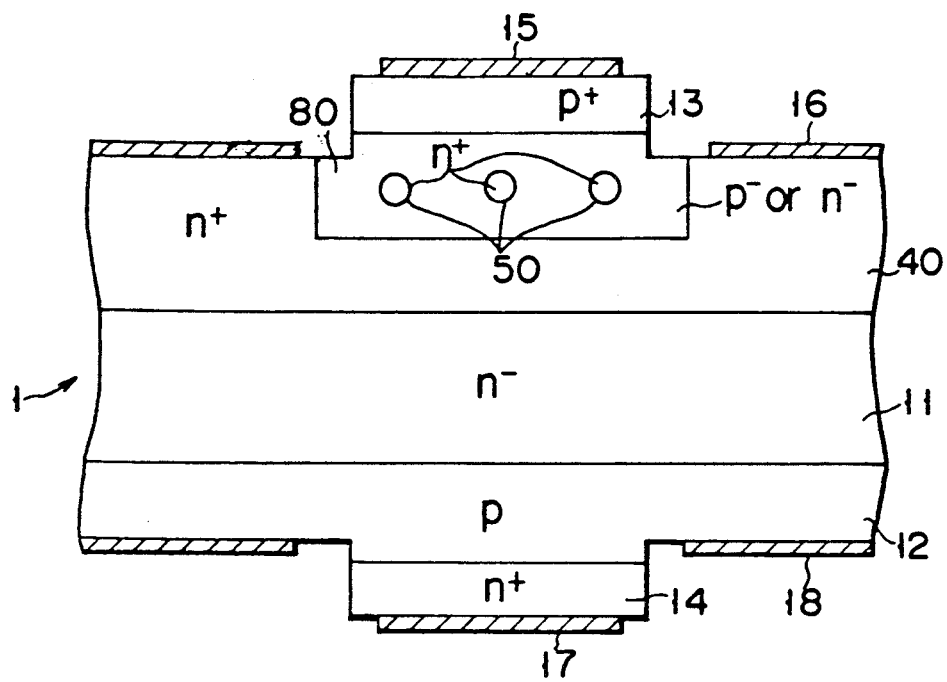
F I G. 18
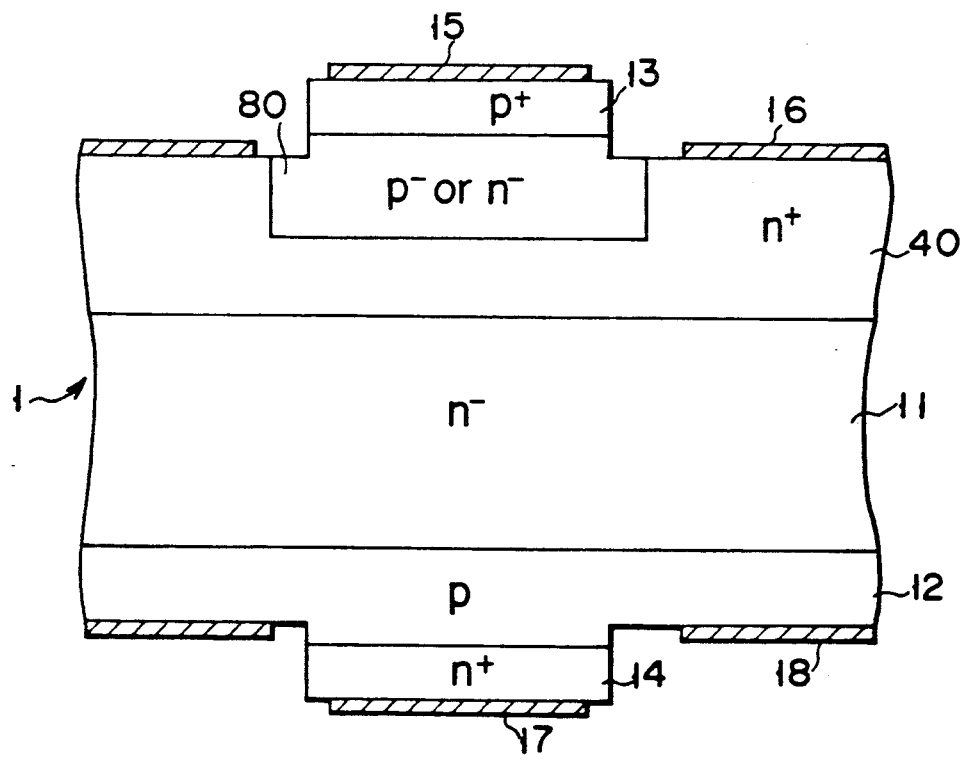
F I G. 19

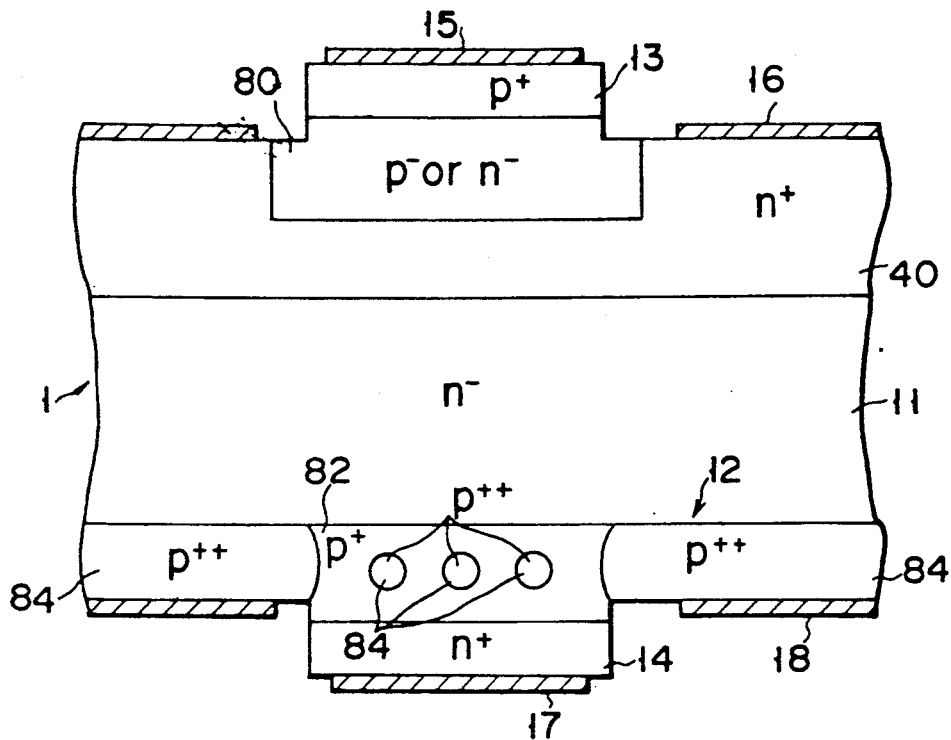
F I G. 20
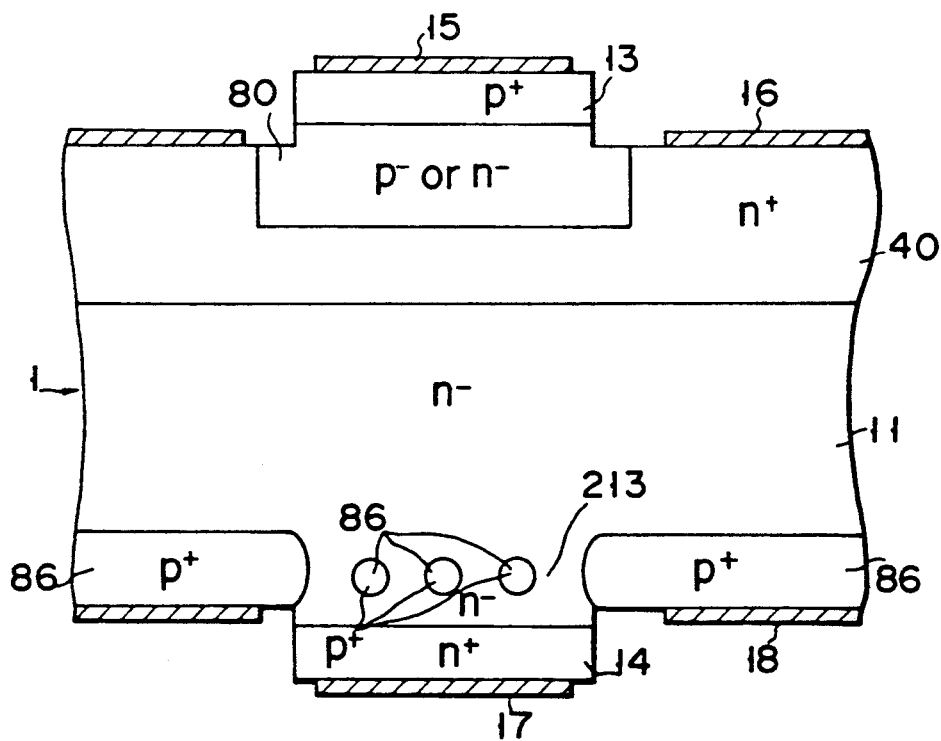
F I G. 21

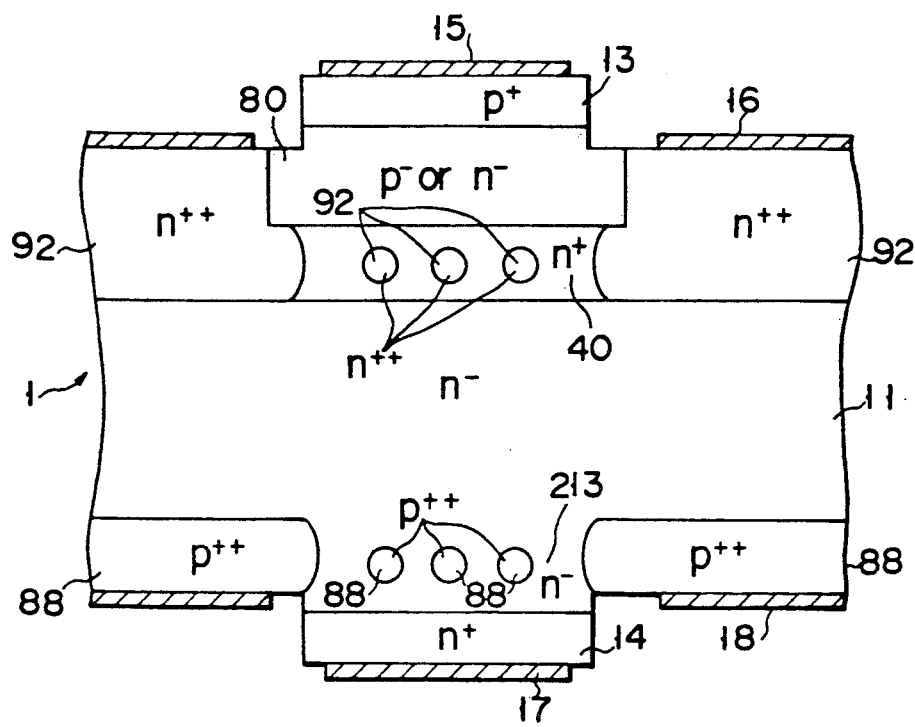
F I G. 24
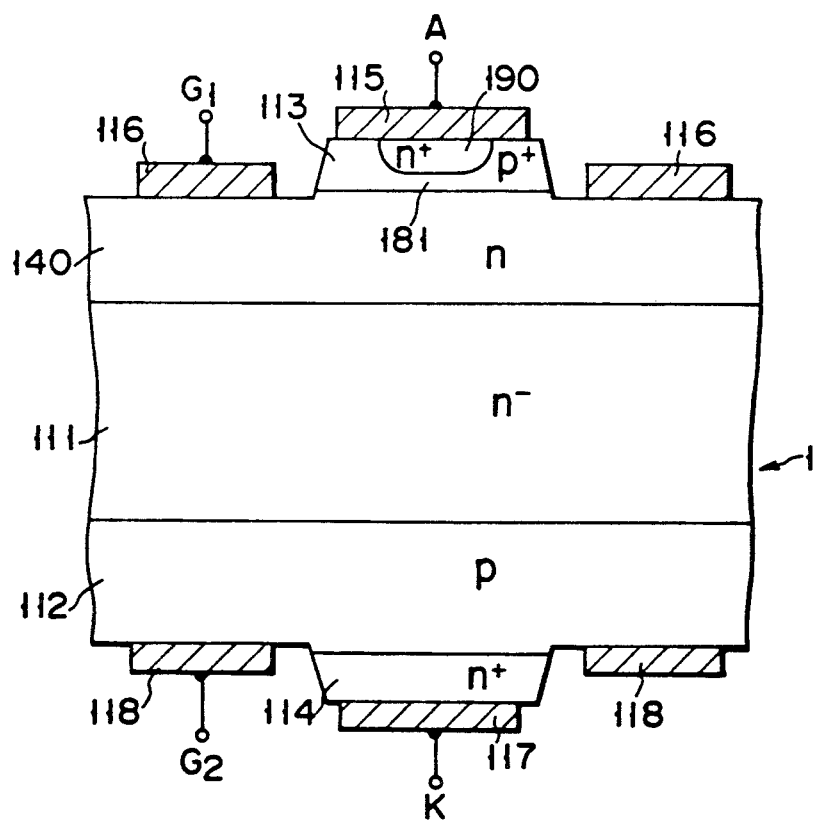
F I G. 25

DOUBLE GATE GTO THYRISTOR

CROSS-REFERENCE TO THE RELATED APPLICATION

This application is a continuation of application Ser. No. 07/292,426, filed on Dec. 30, 1988, now abandoned, which is a continuation-in-part application of a patent application Ser. No. 101,790 filed Sep. 28, 1987.

BACKGROUND OF THE INVENTION

1. Field of the Invention

This invention relates to a double gate GTO thyristor.

The conventional gate turn off thyristor (bbreviated as GTO) with a single gate structure has a problem of slow switching speed. This arises from the facts that the turn-on time is long, the power loss during the turn-off period is large due to large tail current initial value, tail time and turn-off time is long.

2. Description of the Related Art

FIG. 1 illustrates a circuit arrangement for driving the single structure GTO. The gate electrode of GTO element 201 is coupled with the P base layer. The gate electrode is connected to the on-gate power source and the off-gate power source respectively through related switches. Reference numerals 202 and 203 designate a load and a main power source.

FIGS. 2A to 2C illustrate waveforms useful in explaining the operation of GTO element 201 shown in FIG. 1.

The operation of GTO element 201 will be described referring to those figures. At time t1, the switching element of the on-gate circuit is closed. Gate current IG flows from the on-gate power supply in the direction of arrow in FIG. 1. GTO element turns on. Before time t2, the switching element of the on-gate circuit is opened, and at time t2 the switching element of the off-gate circuit is closed. The current flows from the off-gate power source in the direction opposite to that of the gate current IG. Under this condition, no draw-out of current is performed.

A time duration t2 to t3 till the phenomenon of anode current $I_A$ commences is a storage time. During this storage time, the conduction region in GTO element 201 gradually narrows.

From time t3 anode current $I_A$ starts to decrease, while anode voltage starts to increase. Anode current $I_A$ abruptly decreases till time t4. The time duration t3 to t4 is a fall time, and the time duration t2 to t4 is a turn-off time.

A value of the anode current at time t4 is a tail current initial value. The current flowing from time t4 to time t5 is a tail current. The time duration from time t4 to t5 is a tail time, and time duration t2 to t5 is called a turn-off period. The tail current is caused by discharging residual charges from the N base layer. The power loss P ($=V_A \times I_A$) during the period from t1 to t5 is varied as shown in FIG. 2C.

As seen from FIG. 2C, a large power loss occurs during period from t3 to t5. When carefully observing this period, it can easily be understood that the long fall period t3 to t4 increases the power loss, and the large tail current initial value increases the power loss during the tail period.

A measure, which has been taken for decreasing the power loss at the turn-off period, is to reduce the lifetime of carriers in the GTO element by the electron radiation or heavy metal doping process. This measure, however, has problems to increase the turn-on loss and to increase the forward voltage drop.

The gate turn-off thyristor of the double gate structure, to which this invention is directed, is disclosed in KOKAI No. 60-247969 invented by Kawamura, et al., and filed May 23, 1984 by Touyou Denki Seizou Co., Ltd. This Gazette discloses the double gate SI thyristor of N buffer structure. Another KOKAI No. 59-52876 filed by West Germany, discloses the method of driving the double gate thyristor with current sources between the P base and N emitter. Neither of the above Gazettes discloses techniques to solve the above discussed problems.

The double gate GTO thyristor involves a problem of a small gate gain for a gate provided in the N base. This is due to the fact that when the GTO thyristor is in an on state, excess carriers are stored in the high resistance base layer, and it cannot be turned off until the excess carriers are satisfactorily drawn out.

In the case of the GTO thyristor including that of the double gate type and the single gate type as well, when the turn-off speed is increased, the turn-on gate sensitivity is reduced or the reverse breakdown voltage is lowered.

SUMMARY OF THE INVENTION

Accordingly, an object of the present invention is to provide a double gate GTO thyristor which is high in gate gain and gate sensitivity, and may be turned off at a high speed.

The second object of this invention is to provide a double gate GTO thyristor which can reduce the power loss occurring when the GTO of the double gate structure is turned off, and can improve the switching speed, and can be high frequency driven.

In order to achieve the above object of the present invention, there is provided a double gate GTO thyristor, comprising an anode/emitter layer of a first conductivity type; a first base layer of a second conductivity type contacted with the anode/emitter layer to form a first pn junction; a second base layer of the first conductivity type contacted with the first base layer to form a second pn junction; a cathode/emitter layer of the second conductivity type contacted with the second base layer to form a third pn junction; a semiconductor layer of the second conductivity type formed in the anode/emitter layer and located at a surface portion of the anode/emitter layer; an anode electrode connected to the anode/emitter layer and all the surface of the semiconductor layer; a cathode electrode connected to the cathode/emitter layer; a first gate electrode connected to the first base layer; and a second gate electrode connected to the second base layer.

When the semiconductor layer is formed in the anode/emitter layer whose conductivity type is opposite to that of the semiconductor layer, as described above, a carrier density is lowered in the portion where the semiconductor layer is formed. Accordingly, when the GTO thyristor is turned on, in the portion where the semiconductor layer is formed, an efficiency of carriers (holes) injection from the anode/emitter layer to the first base layer is reduced. With the carrier injection efficiency reduction, excess carriers in the first base layer are reduced. This results in high gate gain and high speed turn-off operation. Consequently, the resultant GTO thyristor is operable with high speed turn-off, while maintaining good characteristics of reverse breakdown voltage and gate sensitivity.

A GTO of double gate structure according to this invention further comprises means for reducing the fall time of the anode current at the turn-off time, and means for reducing the tail current initial value of the anode current.

In a drive system for driving the GTO of double gate structure, the fall time reducing means reduces the fall time of the anode current when the thyristor is turned off, and the tail current initial value reducing means reduces the tail current initial value of the anode current.

Therefore, the power loss as the product of the anode voltage and the anode current can be reduced. The reduction of the fall time of anode current at the turn-off time improves the switching speed, allowing high frequency switching operation.

Moreover, a double gate GTO thyristor of the present invention includes a high concentration region of the second conductivity type formed in the first base layer, located in the vicinity of the anode/emitter layer and not in contact with the anode/emitter layer.

According to the above arrangement, the high reverse breakdown voltage between the anode/emitter layer and first gate electrode can be obtained. Therefore, a high voltage can be applied to the first gate electrode. Furthermore, the sequency of operations by the first gate electrode, i.e., the sequency in the first base layer, the electron draw-out, and the suppression of holes injection from anode/emitter layer, more rapidly progresses than that by the second gate electrode. As a result, the fall time of the anode current is reduced, and the hole injection from the anode/emitter layer is suppressed during the fall time. Therefore, the initial value of the tail current is remarkably reduced.

BRIEF DESCRIPTION OF THE DRAWINGS

FIG. 5 shows a circuit diagram of another embodiment of a thyristor drive system for driving a GTO of the double gate structure according to this invention;

FIGS. 6A to 6D show output waveforms of the GTO device shown in FIG. 5;

FIGS. 7A to 7D are a series of schematic illustrations of the GTO when it is driven by the drive system shown in FIG. 5;

FIG. 10 shows a graph illustrating a variation of the turn-off loss with respect to time Δt;

FIGS. 12A to 12H are operating waveforms of the GTO when it is driven by the FIG. 11 drive system;

FIG. 16 shows a circuit arrangement of a drive for driving the GTO;

FIGS. 17A to 17D show a set of waveforms useful in explaining the operation of the GTO when it is driven by the GTO drive system of FIG. 15;

FIGS. 18 and 19 show modifications of the GTO shown in FIGS. 15A and 15B;

FIGS. 20 to 24 are cross sectional views of another embodiments of the double gate GTO thyristors of the present invention; and FIGS. 25 and 26 show a cross sectional views of another embodiments of the double gate GTO thyristor according to this invention.

DETAILED DESCRIPTION OF THE PREFERRED EMBODIMENTS

Some specific embodiments of this invention will be described referring to the accompanying drawings.

Figures 1, 2A, 2B, 2C:
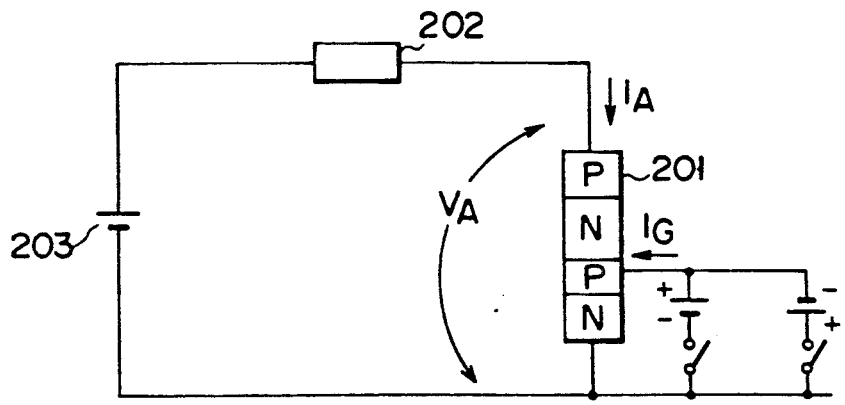
FIG. 1 shows a circuit diagram of a prior thyristor drive system for driving a gate turn-off thyristor (GTO) of the single gate structure.
FIGS. 2A to 2C show waveforms useful in explaining the operation of a GTO of the single gate structure, which is driven by the device shown in FIG. 1.
Figure 3:
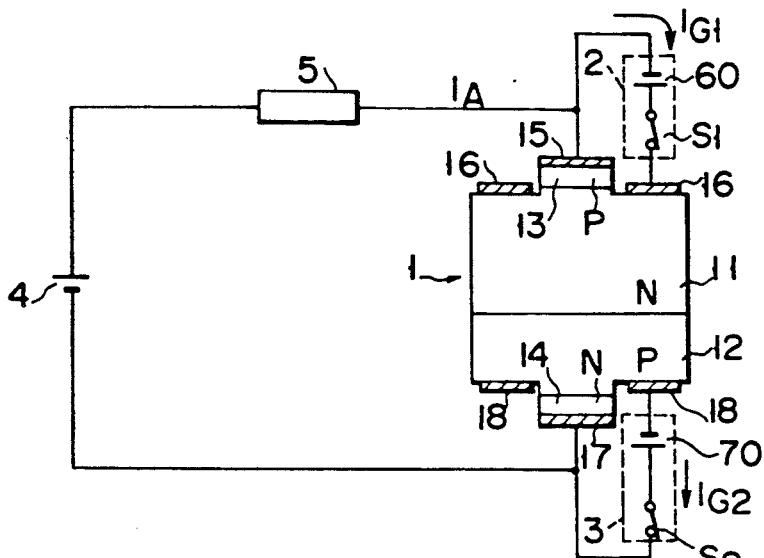
FIG. 3 shows a circuit diagram of a thyristor drive system for driving a GTO of the double gate structure according to this invention.

FIG. 3 shows a circuit diagram showing a thyristor drive system for driving or triggering a gate turn-off thyristor of the double gate structure (simply referred to as a GTO element) according to one embodiment of this invention. Gate turn-off thyristor of the double gate structure has basically a PNPN four layer structure consisting of anode/emitter layer 13, N base layer 11, P base layer 12, and cathode/emitter layer 14. Reference numeral 15 designates an anode electrode, and numeral 17 designates a cathode electrode. N base layer 11 is provided with first gate electrode 16. P base layer 12 is provided with second gate electrode 18.

Off-gate pulse generator 2 made up of off-gate electrode 60 and switching element S1 is coupled with first gate electrode 16. Off-gate pulse generator 3 made up of off-gate electrode 70 and switching element S2 is coupled with second gate electrode 18.

An absolute value of gate current IGp1 flowing into first gate electrode 16 is higher than that of gate current IGp2 flowing out of second gate electrode 18. Reference numeral 4 designates a main power source and numeral 5 a load.

Figure 4:
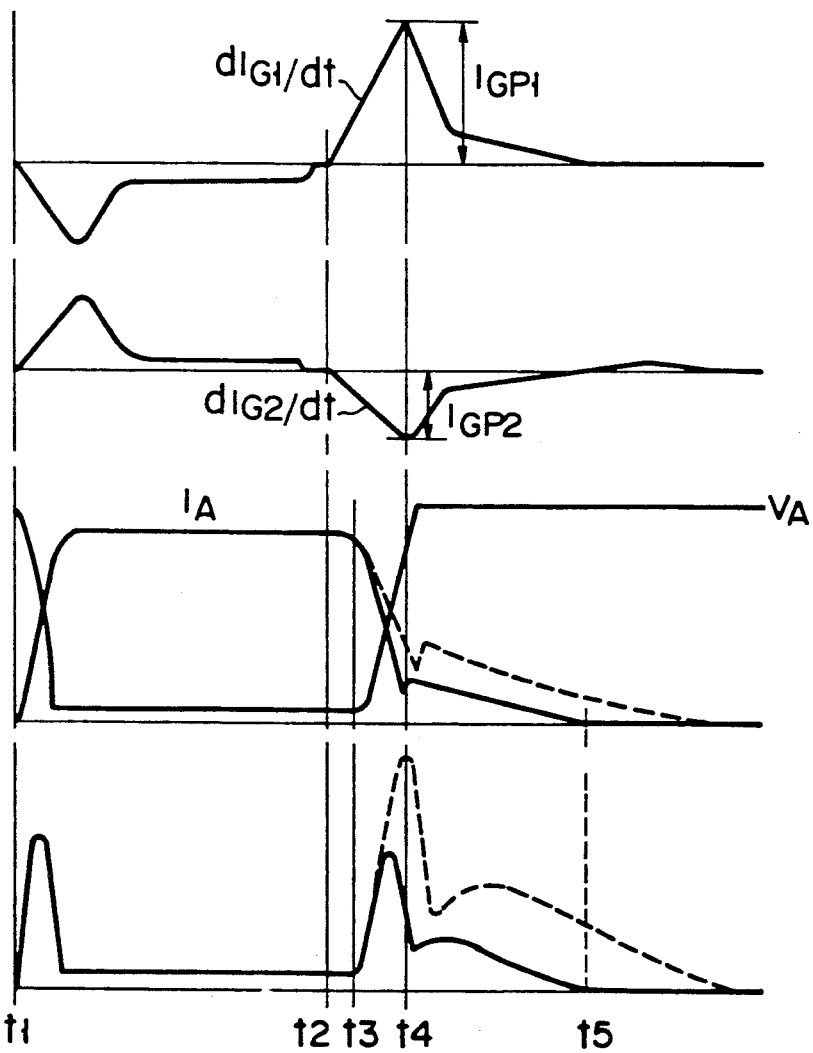
FIGS. 4A to 4D show waveforms useful in explaining the operation of the GTO of the double gate structure, which is driven by the drive system shown in FIG. 3.

The operation of the GTO element when it is driven or triggered by the trigger circuit thus arranged, will be described referring to FIGS. 4A to 4D. Dotted curves in FIG. 4 are the waveforms of the prior GTO of the single gate type, which are used for reference. The turn-off operation of the GTO element after time t2 will be described, with omission of the turn-on operation description.

As shown in FIG. 4, at time t2 switching elements S1 and S2 are closed. A positive turn-off pulse by positive off-gate electrode 60 is applied to first gate electrode 16. A negative turn-off pulse by negative off-gate power source 70, to second gate electrode 18. In GTO element 1, electrons are drawn out by first gate electrode 16. At the same time, holes are drawn out by second gate electrode 18. As the result of the draw-out of electrons and holes, the conduction region is squeezed in N base layer 11 and P base layer 12, to restrict the hole injection from anode/emitter layer 13, and the electron injection from cathode-emitter layer 14.

As recalled, the absolute value of the gate current IGp1 flowing into the first electrode 16 is set to be larger than that of the gate current IGp2 flowing out of second gate electrode 18. Therefore, the following phenomenon occurs in GTO element 1.

The off-gate pulse generators 2 and 3 have the same fundamental constructions. It is assumed, therefore, that the wiring inductances L1 and L2 of these generators have equal values.

A rate of rising of the gate current IG1 flowing into first gate electrode 16 and that of the gate current IG2 flowing into second gate electrode 18 are given by $$d\,IG1/dt = E1/L1$$

$$d\,IG2/dt = E2/L2$$

Since L1=L2, if $|E1| > |E2|$ we have $$|d\,IG1/dt| > |d\,IG2/dt|$$

To realize $|E1| > |E2|$, it is necessary that the breakdown voltage VGR1 between anode/emitter layer 13 and N base layer 11 is designed to be higher than the break-down voltage VGR2 between cathode/emitter layer 14 and P base layer 12. Therefore, charge quantity Q1 of electrons discharged from first gate electrode per unit time is larger than that Q2 of holes from second gate electrode 18, i.e., Q1>Q2. This fact indicates that a sequence of the squeezing of N base layer 11, the draw-out of electrons and the restriction of the hole injection from anode/emitter layer 13 more quickly progresses than the sequence of the squeezing of P base layer 12, the draw-out of holes, and cathode-emitter layer 14. The hole injection from anode/emitter layer 14 is restricted before the fall time terminates, and the tail period starts. As a result, the fall time at the time of turn-off can be reduced without any increase of the turn-on loss and the power loss due to the forward voltage drop, the tail current initial value is remarkably reduced and the tail period is also reduced.

Thus, the drive system for driving the GTO according to this invention successfully achieves the object to solve the power loss problem of the GTO element, and to improve the switching speed of the GTO element.

FIG. 5 shows an arrangement of a second embodiment of a thyristor drive system for driving a double gate type gate turn-off thyristor according to this invention. In the figure, like portions are designated by like reference numerals in FIG. 3. In FIG. 5, reference numeral 20 designates a reference off-gate pulse generator, 21 a first off-gate pulse generator, 22 an off-gate pulse delay circuit, and 23 a second off-gate pulse generator. Since first off-gate pulse generator 21 is used in a high potential condition, it is insulated from reference gate pulse generator 20 and the low potential.

FIGS. 6A to 6D show timing charts of signals S1 to S4 shown in FIG. 5. Reference off-gate pulse generator 20 generates reference pulse S1 as a rectangular wave signal rising at time t1 and falling at time t3. Reference pulse S1 cyclically appears at intervals t5 to t1. First gate pulse generator 21 outputs first gate pulse S2 during the period from t1 to t2, and subsequently produces the pulses respectively. Off-gate pulse delay circuit 22 produces delay pulse signal S3, whose positive going pulse or turn-on pulse is synchronized with the leading edge of reference pulse S1, and whose negative going pulse or turn-off pulse is delayed by $\Delta t = t4 - t3$ from the trailing edge of the reference pulse. Second gate pulse generator 23 receives signal S3, and produces second gate pulse signal S4, whose turn-on pulse is generated at time t1, and turn-off pulse is generated at time t4.

As described above, the turn-off pulse of second gate pulse S1 is generated delayed behind the turn-off pulse of first gate pulse S4 by $\Delta t = t4 - t3$. The phenomena in GTO element 1, which is due to the time lag $\Delta t = t4 - t3$, will be described referring to FIGS. 7A to 7D.

In these figures, like portions are designated by like numerals in FIG. 3. In FIG. 5, off-gate power source 70 is not illustrated, since this figure shows only gate pulse timings.

Figure 7A:
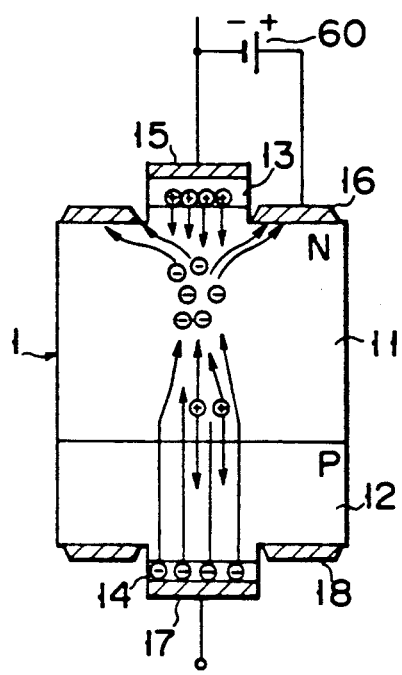

The positive going turn-off pulse S2 by off-gate power source 60 is applied to first gate electrode 16 at time t3. Upon receipt of this pulse S2, the electrode 16 draws out electrons, and the squeezing the conduction region in N base layer 11 starts. Electrons start to flow toward first gate electrode 16. The region to which holes are injected from anode/emitter layer 13, starts to contract toward the center of anode/emitter layer 13 (FIG. 7A).

Figure 7B:
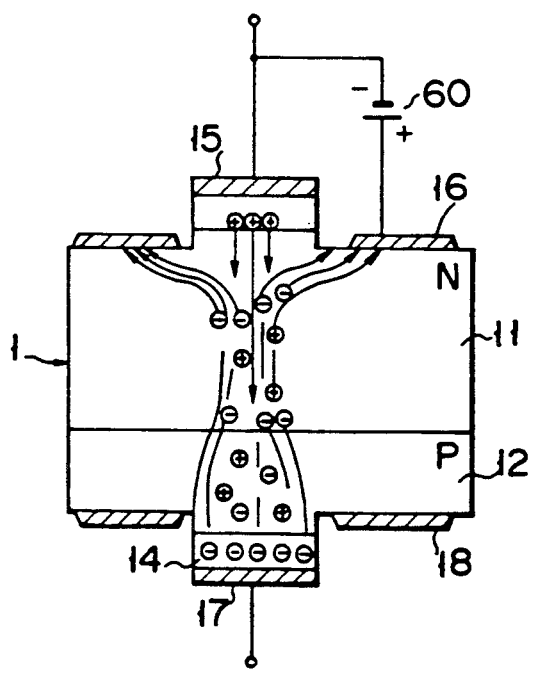

With the elapse of time, the squeezing of phenomenon further progresses. In other words, the hole injection from anode/emitter layer 13 is restricted, but the electron injection from cathode/emitter 14 continues without any restriction (FIG. 7B).

At time t4, switching element S2 of off-gate pulse generator 3 is closed, and negative power voltage E2 by off-gate power source 70 is applied to second gate electrode 18. When positive power voltage E1 is applied to first gate electrode 16 and negative power voltage E2 is applied to second gate electrode 18, at the first stage, the squeezing phenomenon occurs also in the cathode/emitter layer 14, as shown in FIG. 7C, and the restriction of electron injection from cathode/emitter layer 14 starts (FIG. 7C).

The following phenomena may alternatively occur. Following the FIG. 7B stage, the squeeze in anode/emitter layer 13 further progresses and the hole injection from anode/emitter 13 completely stops. The carrier flows through cathode/emitter layer 14, P base layer 12, and N base layer 11, viz. the transistor operation occurs, and the squeeze occurs in cathode/emitter layer 14 shown in FIG. 7C.

Additionally, with time lapsing, the injection of holes and electrons from anode/emitter layer 13 and cathode/emitter 14 stops. As a result, the residual charges are discharged from first gate electrode 16 and second gate electrode 18 (FIG. 7D).

The tail period begins at the start of the residual charge discharging and terminates at the end of the discharging of residual charges.

As recalled, the GTO element used in the instance of FIGS. 7A to 7D has the four layered structure of PNPN. Alternatively, a high concentration buffer may be formed between anode/emitter layer 13 and N base layer 11, to quicken the squeezing of holes flow from anode/emitter layer 13.

Figure 8:
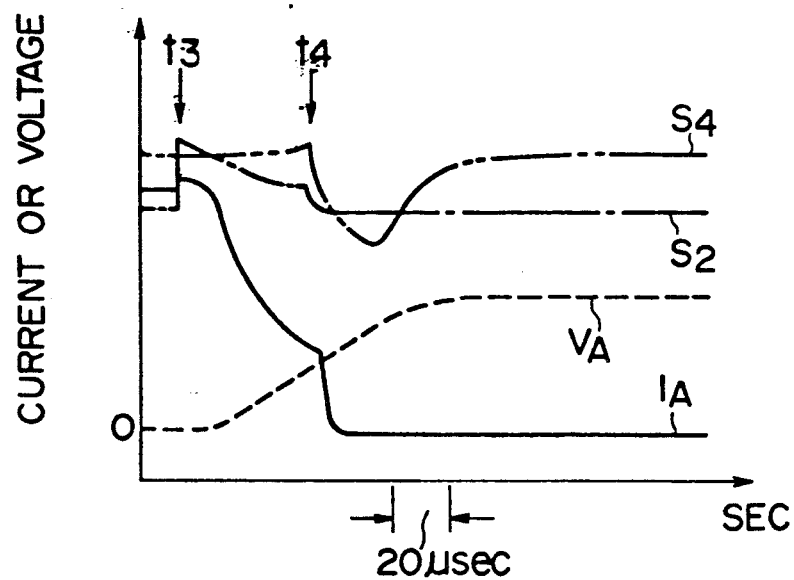
FIG. 8 shows a set of waveforms useful in explaining the operations of the GTO which is placed under the signals of waveforms of FIGS. 6A to 6D output from the FIG. 5 system.

FIG. 8 shows a set of waveforms for explaining the operation of GTO element 1 when it is turned off. As shown in FIG. 8, after the positive turn-off pulse is applied to first gate electrode 16 at time t3, the negative turn-off pulse is applied to the second gate electrode at time t4. Then, the anode current $I_A$ rapidly approaches to zero. When the anode current $I_A$ is approximately zero, the anode voltage $V_A$ is approximately 2000 V.

Figure 9:
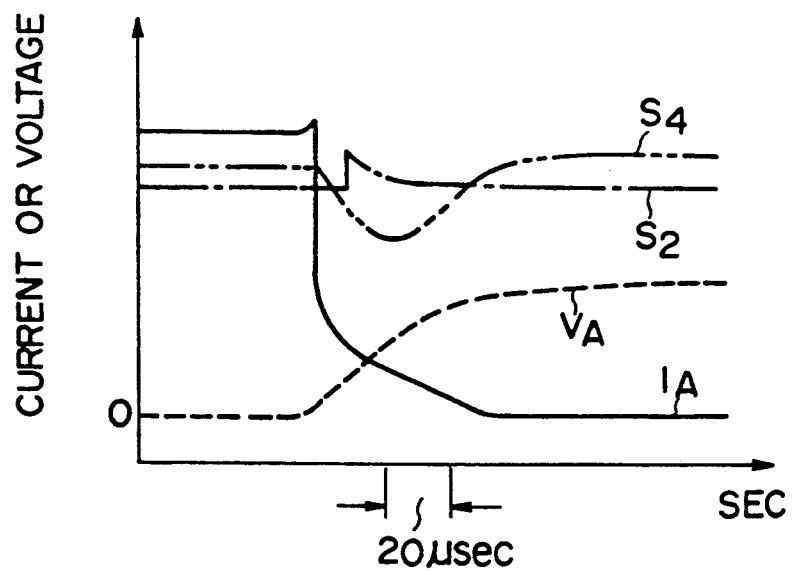
FIG. 9 shows a set of waveforms of signals at key points in the GTO drive system when the input signal applied to the first electrode is delayed from the input signal to the second gate electrode.

FIG. 9 shows a set of waveforms for explaining the operation of the GTO element when the application of the positive turn-off pulse S2 to first gate electrode 16 is delayed behind the application of the negative turn-off pulse S4 to second gate electrode 18, for the comparison the FIG. 8 operation. The anode current IA flowing through GTO element 1 falls along a gentle slope, when it is turned off, and this deteriorates the switching characteristic of GTO element 1.

When the delay time Δt of the generation of the turn-off pulse of first gate pulse S2 from that of the turn-off pulse of second gate pulse S4 is varied, the experimental results of the turn-off loss $E_{OFF}$ when GTO element 1 is turned off are shown in FIG. 10.

As seen from FIG. 10, the turn-off loss is reduced to 50% at Δt=12 μsec, and this figure indicates a minimum point of the power loss reduction.

Figure 11:
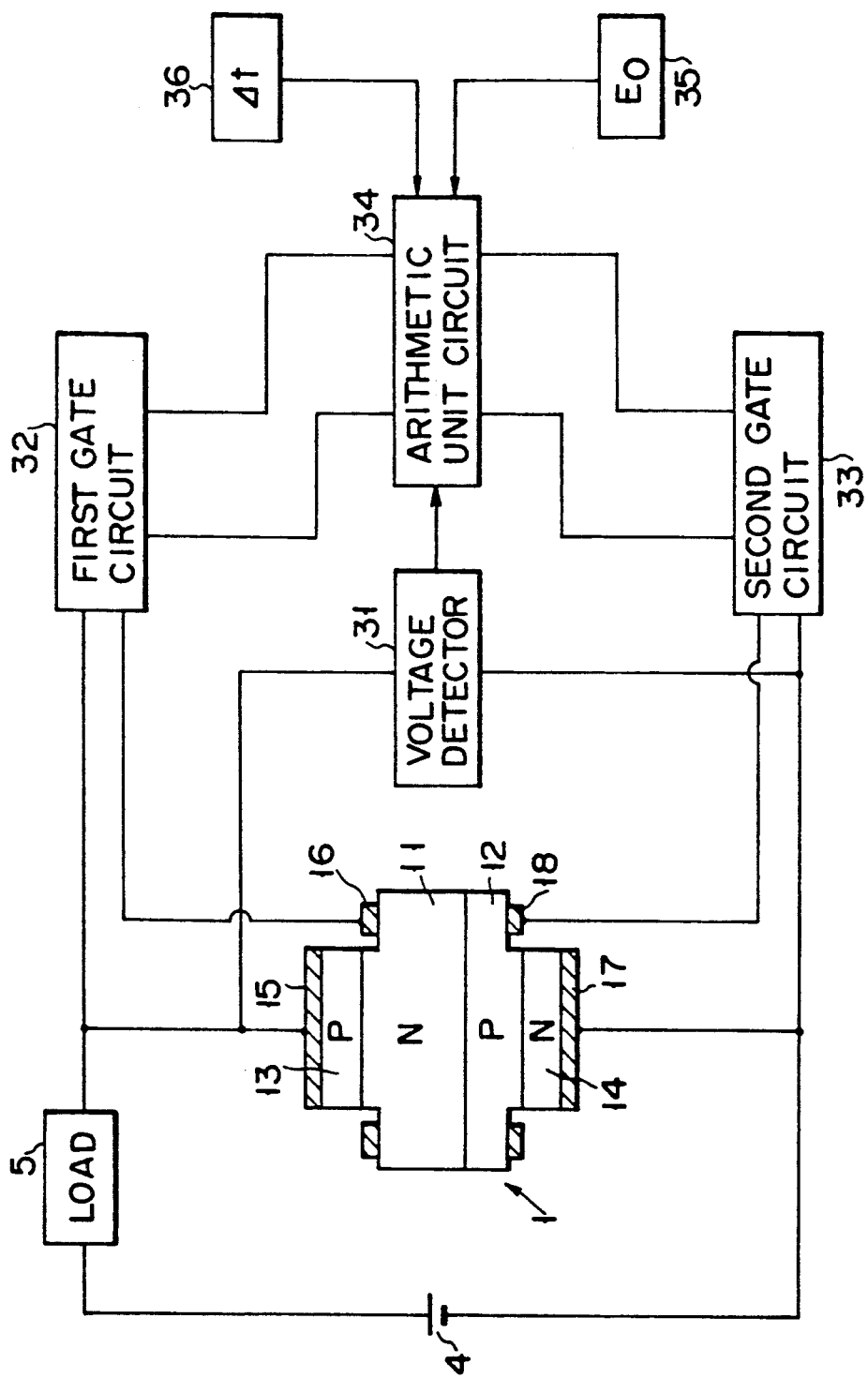
FIG. 11 shows a circuit arrangement of a drive system for the GTO, which is another embodiment of this invention.

FIG. 11 shows another embodiment of a thyristor drive system for driving a double gate type gate turn-off thyristor according to this invention. Like portions are denoted by like numerals in FIG. 3, for simplicity of explanation. GTO element 1 includes first gate circuit 32 for applying the turn-on pulse and turn-off pulse to first gate electrode, and second gate circuit 33 for applying the turn-on pulse and turn-off pulse to second gate electrode 18. Voltage detector 31 is inserted between the anode electrode 15 and the cathode electrode 17 of GTO element 1, and detects a forward voltage $V_A$ between these electrodes 15 and 17. Arithmetic unit circuit 34 reads in the output signals from reference voltage setter 35, reference time setter 36, and voltage detector 31, and controls the timings of gate drive. This circuit 35 consists of CPU, memory, A/D converter, and timer, PIO, etc.

The operation of the thyristor drive system of FIG. 11 will be described referring to FIGS. 12A to 12H. It is assumed that the GTO element 1 is cyclically turned on and off, and that a set value by reference voltage setter 31 is Eo, and a set value by reference voltage setter 36 is Δt. These set values Eo and Δt are sequentially loaded into arithmetic unit circuit 34 according to the flowchart of FIG. 13. Δt is the period of time which lapses after the turn-off pulse has been supplied to first gate electrode 16 and until turn-off pulse is supplied to second gate electrode 18. For the timings of these turn-on and turn-off time pulses, reference is made to FIGS. 12A to 12D. t2 is a time duration between the turn-on pulse application and the turn-off pulse application. The voltage $V_A$ (t2) between anode electrode 15 and cathode electrode 17, which is detected by reference voltage detector when the turn-on pulse is applied to second gate electrode 18, is digitized by the A/D converter in arithmetic unit circuit 34.

Figure 13:
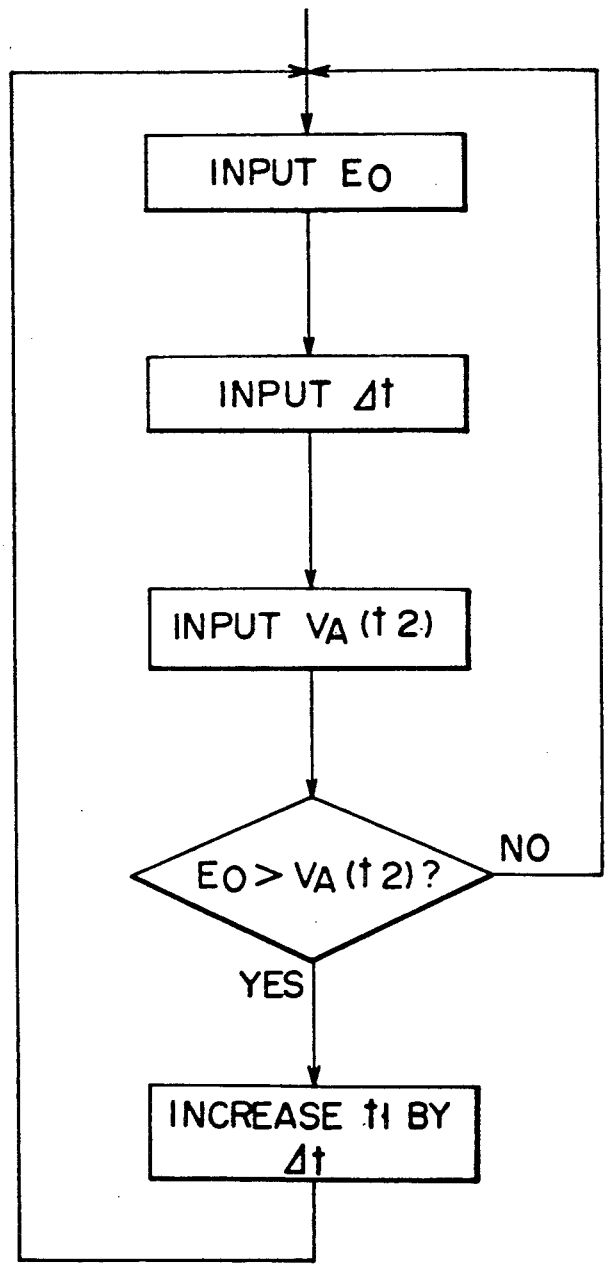
FIG. 13 shows a flowchart illustrating a flow of computing process, which is performed in the arithmetic unit circuit in FIG. 11.

The set voltage E0 loaded into arithmetic unit circuit 34 according to the flowchart of FIG. 13 and the detected voltage $V_A$ (t2) are comparatively computed by the CPU in arithmetic unit circuit 34. When E0>$V_A$ (t2), time Δt is varied according to voltage $V_A$ (t2). The timing of the turn-off pulse applied to first gate electrode 16 is advanced by Δt from the turn-off pulse applied to the second gate electrode 18, by means of the timer in arithmetic unit circuit 34. The waveforms in FIGS. 12E and 12F are those of the pulse current flowing into second gate electrode 18. FIG. 12G shows the waveforms of anode voltage $V_A$ and anode current $I_A$, and FIG. 12H shows a waveform representing the power loss.

In the figures, broken line waveforms are those when the timings of the turn-off pulse to first and second gate electrodes 16 and 18 are not shifted.

When set voltage E0 is smaller than detected voltage $V_A$ (t2), E0<$V_A$ (t2), the initial value of the tail current starts to decrease before t2. Under this condition, the GTO is triggered at fixed timings, without increasing the time Δt to advance the timing of the turn-on pulse applied to first gate electrode 16.

If the gate turn-on thyristor with the double turn-off thyristor regards as the combination of two transistors of pnp and npn, the transistor whose high resistance N base layer 11 is used for the base has more residual charges than the other transistor, and has a small current gain than the latter.

The tail current and tail period can effectively be reduced if the following two conditions are satisfied: (1) to advance the turn-on pulse to the N base layer 11 (first gate electrode 16) of the transistor with the small current gain from the turn-off pulse to P base layer 12 (second gate electrode 18) when the gate turn-on thyristor of the double gate structure is turned off; (2) to set the turn-off current to N base layer 11 to be a predetermined value or more (for the gain, a predetermined value or less).

The reasons for the above and the conditions will be described in detail.

Figure 14A:
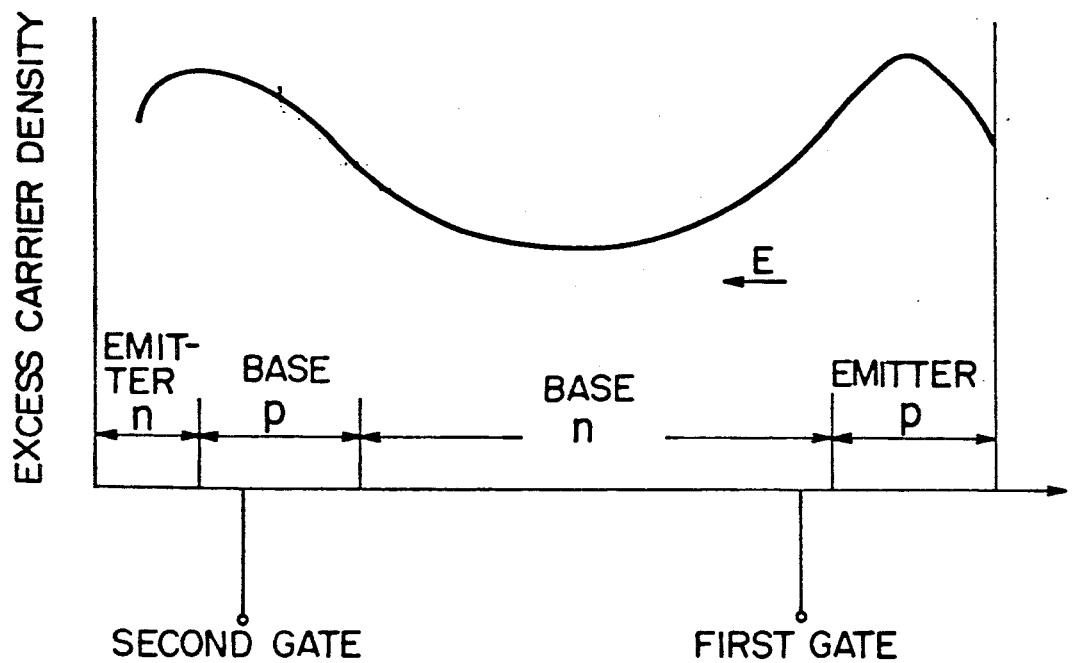
FIGS. 14A and 14B show profiles of carrier concentration distributions in the GTO, which are observed when the GTO is operating.

FIG. 14A shows a carrier distribution in the double gate type turn-off thyristor when it is in an on-condition. N base layer 11 is for the first base layer, and P base layer 12 for the P base layer. These base layers have first and second gate electrodes 16 and 18, respectively.

Figure 14B:
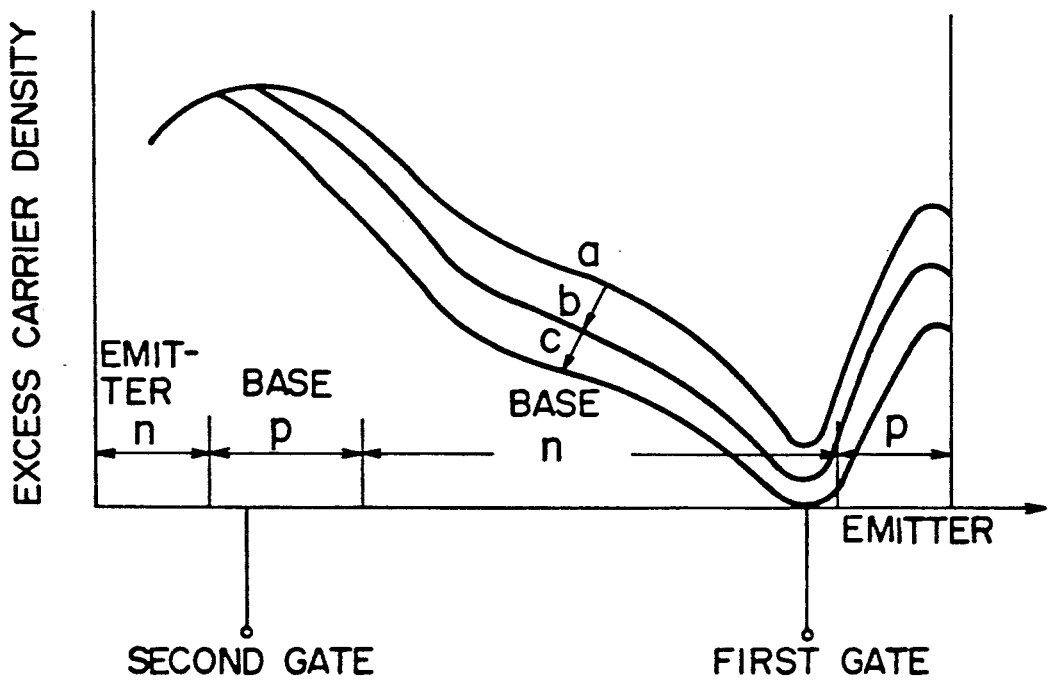

When the turn-on pulse is applied to first gate electrode 16, the carriers in N base layer 11 are partially discharged. As a result, the carrier distribution of FIG. 14A is changed as shown in FIG. 14B. The causes for such carrier distribution change will be discussed.

In N base layer 11, electron density n is equal to hole density p, n=p. Under this condition, hole current Jp and electron current Jn are $$Jp = \mu_p kT(\delta p/\delta x) + q\mu_p pE$$

$$Jn = \mu_n kT(\delta n/\delta x) + q\delta n \, nE$$

The condition to cause a depression in the carrier distribution curve at the location of first gate electrode 16 is given by $$|Jp|/\mu_p > |Jn|/\mu_n$$

Rearranging this relation, we have $$|Jp|/|Jn| > \mu_n/\mu_p = 2.7$$

Hence, we have $$|Jn|/|Jn| + |Jp| \geq 0.73$$

This relation indicates that to sufficiently discharge the carriers in N base layer 11, a ratio of the electron current Jn, i.e., the current flowing into first gate electrode 16, to the whole current (Jp+Jn), must be 73% or more. In other words, if the turn-off pulse is continuously applied to first gate electrode 16, the carriers in N base layer 11 are discharged, to obtain the carrier distribution shown in FIG. 14B.

Assuming that the gate current is the whole current (Jp+Jn), the time t until such carrier distribution is obtained is expressed $$t = 500 \times 5 \times 10^{16} \times 1.6 \times 10^{-19}/200$$
$$= 2.0 (\mu sec)$$

where the width of N base layer 11 is 550 μm, the carrier density is $5 \times 10^{16}/cm^3$, and the gate current is 200 A/cm². The actual time is much longer than this figure, 2.0 μsec. Therefore, the carriers discharge hole density p, n=p. Under this condition, hole current Jp and electron current Jn are $$Jp = \mu_p kT(\delta p/\delta x) + q\mu_p pE$$

$$Jn = \mu_n kT(\delta n/\delta x) + q\delta n \, nE$$

The condition to cause a depression in the carrier distribution curve at the location of first gate electrode 16 is given by $$|Jp|/\mu_p > |Jn|/\mu_n$$

Rearranging this relation, we have $$|Jp|/|Jn| > \mu_n/\mu_p = 2.7$$

Hence, we have $$|Jn|/|Jn| + |Jp| \geq 0.73$$

This relation indicates that to sufficiently discharge the carriers in N base layer 11, a ratio of the electron current Jn, i.e., the current flowing into first gate electrode 16, to the whole current (Jp+Jn), must be 73% or more. In other words, if the turn-off pulse is continuously applied to first gate electrode 16, the carriers in N base layer 11 are discharged, to obtain the carrier distribution shown in FIG. 14B.

Assuming that the gate current is the whole current (Jp+Jn), the time t until such carrier distribution is obtained is expressed $$t = 500 \times 5 \times 10^{16} \times 1.6 \times 10^{-19}/200$$
$$= 2.0 (\mu sec)$$

where the width of N base layer 11 is 550 μm, the carrier density is $5 \times 10^{16}/cm^3$, and the gate current is increases by approximately 10 to 100 V after the application of this pulse to first gate electrode 16.

Figure 15A:
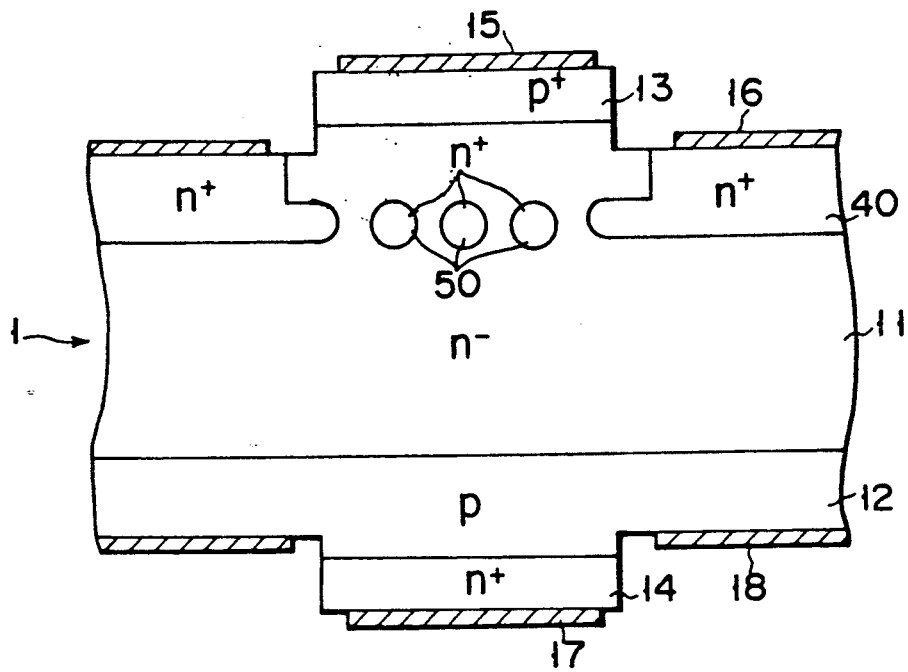
FIGS. 15A and 15B show a cross sectional view and a plan view, which well illustrate the internal structure of the GTOs of FIGS. 3, 5 and 10.
Figure 15B:
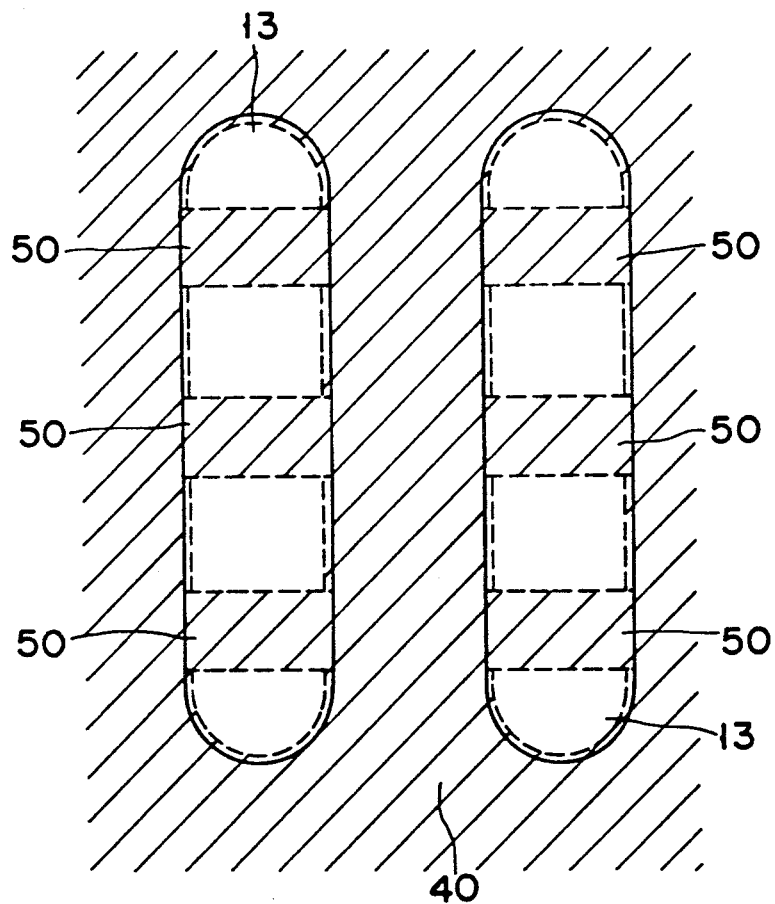

Referring to FIGS. 15A and 15B, there are illustrated a cross sectional view and a plan view of GTO element 1, when a high concentration layer is formed in the N base layer of GTO element 1. The plan view is as viewed from the anode/emitter layer side. In this figure, like portions are designated by like reference numerals in FIG. 3. In these figures, N type high concentration layers designated by reference numerals 40 and 50 are interconnected as well illustrated in FIG. 15B. The average concentration of these layers 40 and 50 is $10^{15}$ cm$^{-3}$ or more.

Turning now to FIG. 16, there is shown an arrangement of a thyristor drive system for driving the gate turn-off thyristor of the double gate structure, which is another embodiment of this invention. The illustration of FIG. 16 is the one when GTO element 1 is in an off state. The polarities of the bias voltage for first and second gates are positive and negative, respectively, as shown. Under this condition, electrons are drawn out through first gate electrode 16, and the squeeze phenomenon occurs in N base layer 11. Holes are drawn out through second gate electrode 14 and the squeeze also occurs, to restrict the injection of electrons from cathode/emitter layer 14.

In GTO element 1 shown in FIGS. 15A and 15B, the reverse breakdown voltage between the anode/emitter layer 13 and first gate electrode 16 is high. Therefore, a high voltage can be applied to first gate electrode 16. The high concentration portion of the gate is distributed in a comb fashion right under the anode. With these features, the sequence of operations by first gate electrode 16, the squeeze in N base layer 11, the electron draw-out, and the restriction of holes injection from anode/emitter layer 13 more rapidly progresses than that by second gate electrode 18, i.e., the squeeze in P base layer 12, the draw-out of holes, and the restriction of electron injection from cathode/emitter layer 14. As a result, the fall time of the anode current is reduced, and the hole injection from anode/emitter layer 13 is restricted during the fall time, and the operation enters the tail period. Therefore, the initial value of the tail current is remarkably reduced when comparing with the prior GTO element.

The sequence of operations of GTO element 1 will be described referring to FIGS. 17A to 17D illustrating operation waveforms of the GTO element.

The anode current IA of the GTO according to this invention is indicated by a continuous line, while that of the prior GTO is indicated by a broken line. These are greatly different in the amplitudes, the tail currents, and the initial values of the tail currents. From these waveforms, it can easily be understood that the power loss of the GTO drive system of this embodiment is considerably reduced.

One of the effective ways to reduce the power loss by decreasing the tail current of the GTO thyristor of the structure shown in FIG. 15A, is to reduce $|dI_G/dt|$. This is realized by coupling an inductance with the first gate. The measure of the inductance connection is advantageous in that the power loss can be reduced regardless of a difference between the times to apply voltage to the first and second gates.

FIG. 18 shows yet another modification of the GTO drive system according to this invention. In the GTO element of FIG. 18, the high concentration layer 40 to serve as an anode gate is uniform in contact with N base layer 11, to form the known buffer structure. Comb shaped high concentration layer 50 is partially layered in the P− low concentration layer or N− low concentration layer located between high concentration layer 40 and anode/emitter layer 13, and partially contacts with high concentration layer 40 of GTO element 1 shown in FIGS. 15A and 15B. Such structure improves the breakdown voltage of the GTO element shown in FIGS. 14A and 14B.

FIG. 19 shows a further modification of GTO element 1. This modification is featured by low concentration layer 70 formed between high concentration layer 40 and anode/emitter layer 13. In this GTO, if the positive turn-off pulse is applied to first gate electrode 16 and the negative turn-off pulse is applied to second gate electrode 19, the conduction region squeezing, the electron draw-out, and the restriction of the hole injection from the anode/emitter layer are performed in the anode side. Also in the cathode side, the conduction area squeezing, the hole draw-out and the restriction of electron injection from cathode-emitter layer are performed. With such structure of the GTO element 1, when the GTO element is in the turn-off mode, the sequence of the squeezing in N base layer 11, the electron draw-out, and the restriction of hole injection from anode/emitter layer 13, more quickly progresses than the sequence of the squeezing in P base layer 12, the hole draw-out, and the restriction of electron injection from cathode/emitter layer 14. As a result, the turn-off loss when the GTO element 1 is turned off, can be reduced.

A further embodiment of this invention will be described with reference to FIG. 20.

P− or N− semiconductor layer 80 is formed in contact with p+ anode/emitter layer 13. Semiconductor layer 80 is formed in N+ buffer layer 40 N+ buffer layer 40 is underlaid with N− high resistance layer 11. This layer 11 functions as a first base layer. The layer 11 is underlaid with a second base layer 12 of P type. Base layer 12 is made up of P+ semiconductor layer 82, p++ layer 84 of high concentration, which is buried in P+ semiconductor layer 82. N+ cathode/emitter layer 14 is formed in contact with base layer 12. Anode electrode 15 is connected to anode/emitter layer 13; cathode electrode 17, to cathode/emitter layer 14; first gate electrode 16, to N+ buffer layer 40; second gate electrode 18, to p++ buried layer 84.

In this embodiment, a lateral resistance of base layer 12 is lowered due to presence of the P++ buried layer, so that a large current may be turned off.

An additional embodiment of this invention will be described with reference to FIG. 21. In this embodiment, P+ gate layer 86, which corresponds to P base layer 12, is formed in a lattice fashion in N− layer 11. The gate layer 86 provides an electrostatic induction transistor structure. In the structure, conductance of the channel of channel region 213 is controlled by the potential applied to gate layer 86. This embodiment is capable of turning off a large current, through the electrostatic induction transistor action of gate layer 86. The remaining structure of the element of this embodiment is substantially the same as the corresponding portion of the FIG. 20 embodiment. With designation by like reference numeral for like portions, no further description will be given.

Figure 22:
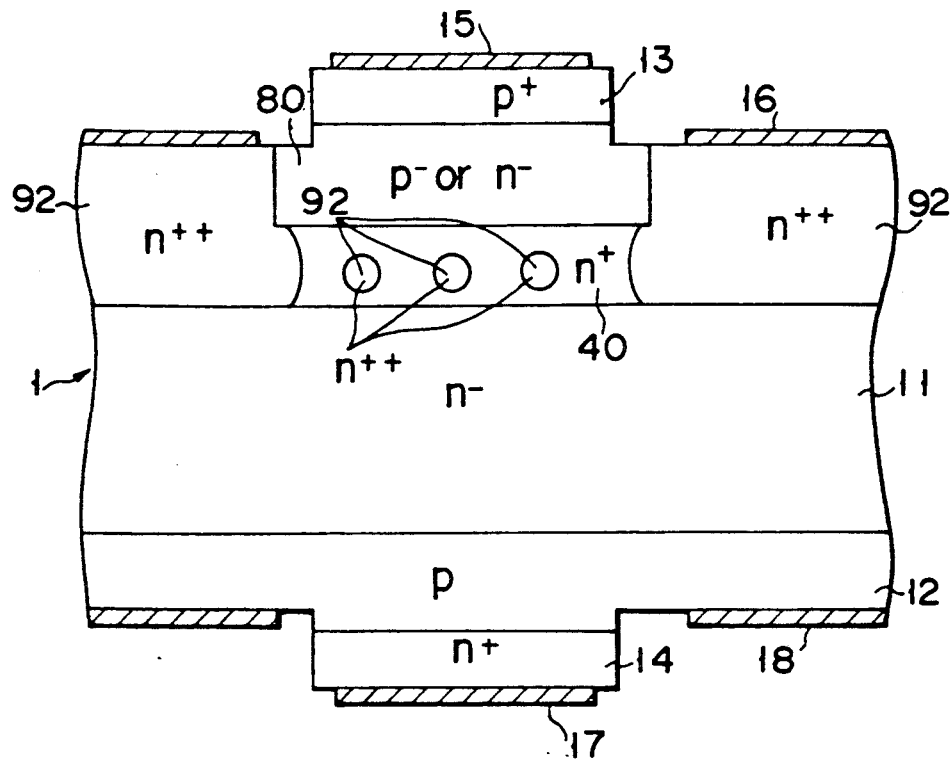

FIG. 22 shows another embodiment of the present invention in which N++ high concentration buried layer 92 is formed in N+ buffer layer 40. P layer 12 is used for the second base layer. The remaining structure of the element of this embodiment is substantially the same as the corresponding portion of the FIG. 20 embodiment. With designation by like reference numeral for like portions, no further description will be given. In this embodiment, a lateral resistance of the N+ buffer layer 40 is lowered due to presence of the N++ buried layer 92, so that a high speed turn-off operation is possible.

Figure 23:
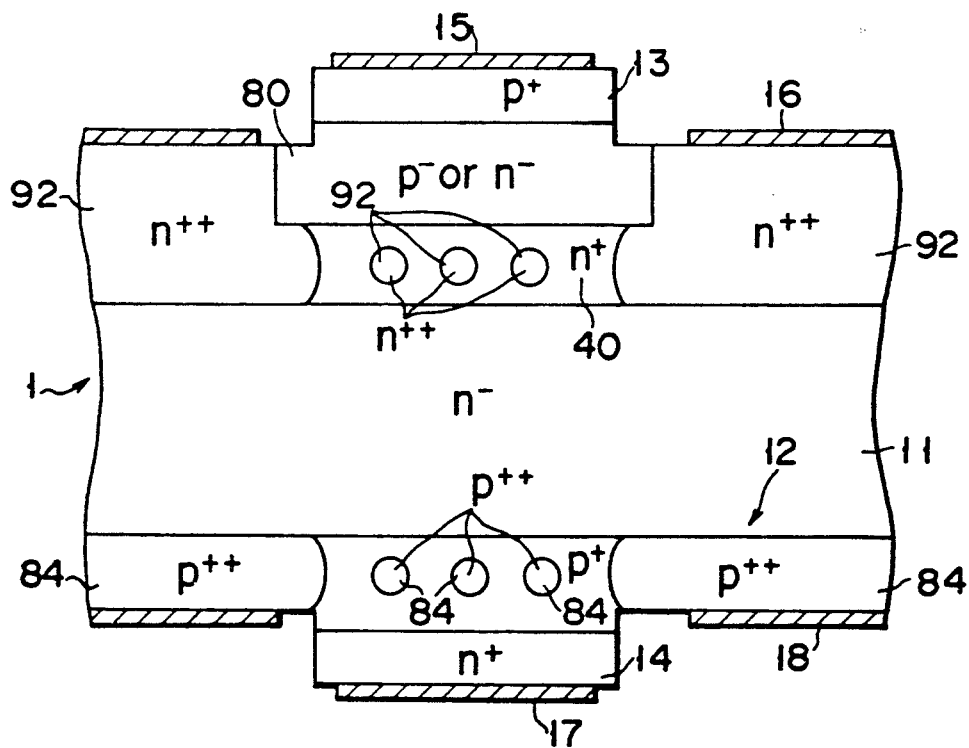

FIG. 23 shows yet another embodiment of the present invention which is a combination of the embodiments of FIGS. 20 and 22. This embodiment is capable of turning off a large current at a high speed.

FIG. 24 shows a double gate GTO thyristor according to still another embodiment of the present invention which is a combination of the embodiments of FIGS. 21 and 22. Gate layer 88 is higher in concentration than the gate layer 86 of FIG. 21, thereby reducing gate resistance. This embodiment is capable of turning off a large current at a high speed.

Another embodiment of a double gate GTO thyristor according to the present invention will be described with reference to FIG. 25.

A GTO thyristor is basically composed of four layers, N emitter layer 114, P base layer 112, N− high resistance base layer 111, and P emitter layer 113. N buffer layer 140 is interlayered between high resistance base layer 111 and P emitter layer 113. N emitter layer 114 is provided with cathode electrode 117, and P emitter layer 113, with anode electrode 115. P base layer 112 is provided with second gate electrode 118, and N base layer 140, with first gate electrode 116. In this embodiment, N diffusion layer 190 is selectively formed in P emitter layer 113, and the former is shallower than the latter. N diffusion layer 190 is connected at the entire surface to anode electrode 115.

With provision of N diffusion layer 190 in P emitter layer 113, a carrier density of P emitter layer 113 in the portion of the N diffusion layer is lower than that in the remaining portion of P emitter layer 113. Accordingly, in an on state of the element, when a carrier density in N− base layer 111 and N buffer layer 140 becomes higher than that in the P emitter layer 113 in the portion of N diffusion layer 190, carriers begin to flow from N buffer layer 140 directly into N diffusion layer 190, and consequently an injection efficiency of P emitter layer 113 reduces in the portion of N diffusion layer 190. Thus, substantially the same effect as that by the anode short-structure may be obtained. As a result, under N diffusion layer 190, an amount of the excess carrier storage decreases, and a gain of first gate electrode 116 in a turn-off state of the element is high. To enhance this effect, it is preferable that an impurity concentration of P emitter layer 181 right under N diffusion layer 190 is set at less than $5 \times 10^{17}/cm^3$.

In an actual turn-off operation, an off-gate pulse is first applied to first gate electrode 116, and after a predetermined period of time, than an off-gate pulse is applied to second gate electrode 118. The resultant turn-off operation is effectively performed with small turn-off loss. In this embodiment, the turn-off operation may be made with the gate current to first gate electrode 116, which is smaller than that of the conventional one. Since N diffusion layer 190 is formed within P emitter layer 113, the reverse breakdown voltage may be kept at a value higher than that of the anode-short structure. Further, for the excess carrier storage, the N diffusion layer portion functions substantially as an anode-short structure, and a high speed turn-off is possible.

Figure 26:
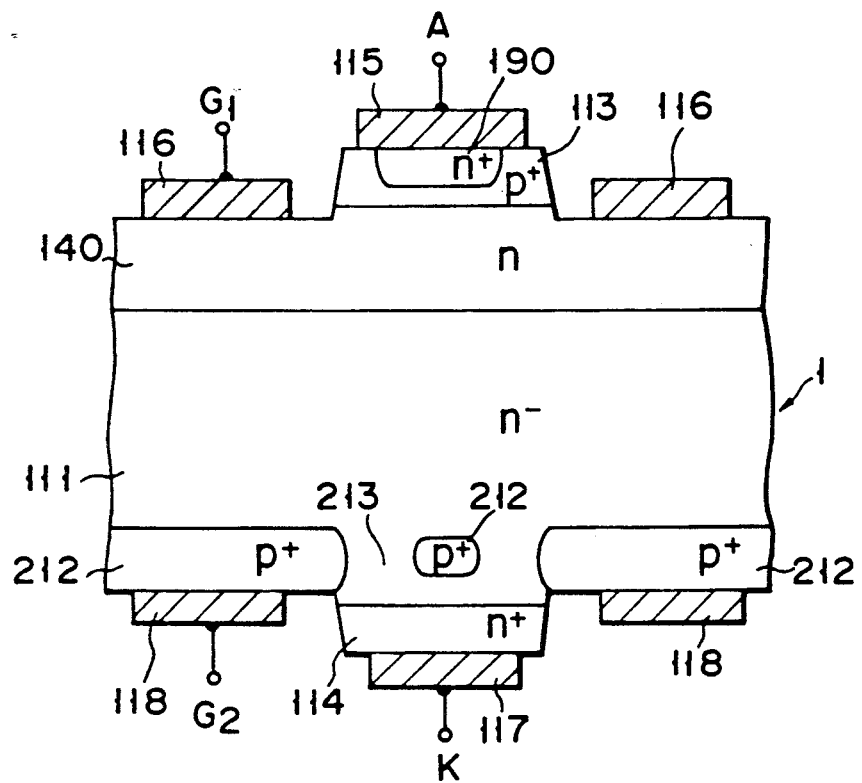

FIG. 26 shows a structure of a key portion of an embodiment in which the cathode side has an electrostatic induction transistor structure. P gate layer, which corresponds to p base layer 112 in the embodiment of FIG. 25, is formed in a lattice-like fashion. This p gate layer 212 controls a potential in channel region 213, and hence controls the transistor operation. The remaining portion of the structure is substantially the same as that of the FIG. 25 embodiment. High resistance base layer 111 may be either of the P⁻ type or N⁻ type.

The effects obtained by this embodiment are comparable with those by the FIG. 25 embodiment.

To drive the double gate GTO thyristors of FIGS. 25 and 26, the drive systems shown in FIGS. 3, 5, 11 and 16 are available.

What is claimed is:

1. A double gate GTO thyristor comprising:
   an anode/emitter layer of a first conductivity type;
   a first base layer of a second conductivity type contacted with said anode/emitter layer to form a first pn junction;
   a second base layer of the first conductivity type contacted with said first base layer to form a second pn junction;
   a cathode/emitter layer of the second conductivity type contacted with said second base layer to form a third pn junction;
   a semiconductor layer of the second conductivity type formed in said anode/emitter layer and located at a surface portion of said anode/emitter layer;
   an anode electrode connected to said anode/emitter layer and all the surface of said semiconductor layer;
   a cathode electrode connected to said cathode/emitter layer;
   a first gate electrode connected to said first base layer; and
   a second gate electrode connected to said second base layer.

2. The thyristor according to claim 1, wherein said first base layer includes
   a buffer layer of the second conductivity type contacted with said anode/emitter layer to form said first pn junction; and
   a low concentration semiconductor layer of the second conductivity type formed between said buffer layer and said second base layer.

3. The thyristor according to claim 1, wherein
   said second base layer is formed to be a matrix form, and
   said cathode/emitter layer and said first and second base layer constitute an electrostatic induction transistor.

4. A double gate GTO thyristor drive system comprising:
   an anode/emitter layer of a first conductivity type;
   a first base layer of a second conductivity type contacted with said anode/emitter layer to form a first pn junction;
   a second base layer of the first conductivity type contacted with said first base layer to form a second pn junction;
   a cathode/emitter layer of the second conductivity type contacted with said second base layer to form a third pn junction;
   a semiconductor layer of the second conductivity type formed in said anode/emitter layer and located at a surface portion of s id anode/emitter layer;
   an anode electrode connected to said anode/emitter layer and all the surface of said semiconductor layer;
   a cathode electrode connected to said cathode/emitter layer;
   a first gate electrode connected to said first base layer;
   a second gate electrode connected to said second base layer.
   first means, connected between said first gate electrode and said anode/emitter layer, for applying to said first gate electrode a first turn-off pulse of a predetermined amplitude allowing said thyristor to be turned off; and
   second means, connected between said second gate electrode and said cathode/emitter layer, for applying to said second gate electrode a second turn-off pulse.

5. A double gate GTO thyristor comprising:
   an anode/emitter layer of a first conductivity type;
   a first base layer of a second conductivity type contacted with said anode/emitter layer to form a first pn junction;
   a second base layer of the first conductivity type contacted with said first base layer to form a second pn junction;
   a cathode/emitter layer of the second conductivity type contacted with said second base layer to form a third pn junction;
   a high concentration region of the second conductivity type formed in said first base layer, located in the vicinity of said anode/emitter layer and not in contact with said anode/emitter layer;
   an anode electrode connected to said anode/emitter layer;
   a cathode electrode connected to said cathode/emitter layer;
   a first gate electrode connected to said first base layer and said high concentration region; and
   a second gate electrode connected to said second base layer.

* * * * *

UNITED STATES PATENT AND TRADEMARK OFFICE
CERTIFICATE OF CORRECTION

PATENT NO. : 5,132,767
DATED : July 21, 1992
INVENTOR(S) : Tsuneo Ogura et al.

It is certified that error appears in the above-identified patent and that said Letters Patent is hereby corrected as shown below:

On the title page, Item [75],

The third inventor's name is spelled incorrectly, should be,

--Akio Nakagawa--

Signed and Sealed this

Second Day of November, 1993

Attest:

BRUCE LEHMAN

*Attesting Officer*   *Commissioner of Patents and Trademarks*